(12) United States Patent
Wu

(10) Patent No.: US 12,088,250 B2
(45) Date of Patent: Sep. 10, 2024

(54) THERMALLY COMPENSATED CIRCUITS

(71) Applicant: MACRONIX INTERNATIONAL CO., LTD., Hsinchu (TW)

(72) Inventor: Hsien-Hung Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 47 days.

(21) Appl. No.: 17/986,606

(22) Filed: Nov. 14, 2022

(65) Prior Publication Data
US 2024/0162858 A1 May 16, 2024

(51) Int. Cl.
*H03B 5/04* (2006.01)
*H03B 5/24* (2006.01)

(52) U.S. Cl.
CPC .............. *H03B 5/04* (2013.01); *H03B 5/24* (2013.01)

(58) Field of Classification Search
CPC ........................................................ H03B 5/04
USPC ............................................................ 331/66
See application file for complete search history.

(56) References Cited

U.S. PATENT DOCUMENTS

| | | | |
|---|---|---|---|
| 5,982,241 A | 11/1999 | Nguyen et al. | |
| 6,157,270 A | 12/2000 | Tso | |
| 6,825,735 B2 | 11/2004 | Chung | |
| 7,129,798 B2 | 10/2006 | Aoyama | |
| 7,227,422 B2 | 6/2007 | Yarborough, Jr. | |
| 7,251,158 B2 | 7/2007 | Hsia et al. | |
| 7,385,453 B2 | 6/2008 | Nervegna | |
| 7,432,771 B2 | 10/2008 | Chui | |
| 7,598,822 B2 | 10/2009 | Rajagopal | |
| 7,654,736 B1 | 2/2010 | Walker | |
| 7,719,371 B2 | 5/2010 | Pernia et al. | |
| 7,843,279 B2 | 11/2010 | Chou | |
| 8,058,941 B2 | 11/2011 | Kurogo et al. | |
| 8,093,958 B2 | 1/2012 | O'Day | |
| 8,203,393 B1 | 6/2012 | Leon | |
| 8,212,624 B2 | 7/2012 | Tokunaga et al. | |
| 8,493,114 B2 | 7/2013 | Cho | |
| 8,497,741 B2 | 7/2013 | Pedersen et al. | |
| 8,729,969 B2 * | 5/2014 | Huang | H03K 3/0231 331/111 |

(Continued)

FOREIGN PATENT DOCUMENTS

TW            202137702 A     10/2021

*Primary Examiner* — Joseph Chang
(74) *Attorney, Agent, or Firm* — Andrew L. Dunlap; Haynes Beffel & Wolfeld LLP

(57) ABSTRACT

A thermally compensated circuit includes a first adjustable circuit, like an adjustable current source, to produce a first adjustable signal, such a reference current. The circuit includes a second adjustable circuit to produce a second adjustable signal, such as a reference voltage. Circuitry responsive to the first and second adjustable signals produces an output, such as a clock signal. A tunable circuit in the first adjustable circuit and a tunable first element of the second adjustable circuit set an operating characteristic, such as a clock period, of the output to a target level at a first temperature. A tunable second element of the second adjustable circuit sets the operating characteristic of the output signal at the target level at a second temperature. Tuning of the second tunable element at the second temperature does not substantially change the operating characteristic of the output signal at the first temperature.

19 Claims, 5 Drawing Sheets

(56) References Cited

U.S. PATENT DOCUMENTS

| | | | |
|---|---|---|---|
| 8,878,621 | B2 | 11/2014 | Matsuzaki et al. |
| 8,988,157 | B2 | 3/2015 | Tokairin |
| 9,197,263 | B2 | 11/2015 | Onishi |
| 9,209,814 | B2 | 12/2015 | Matsuo |
| 9,231,519 | B2 | 1/2016 | Wei |
| 9,461,623 | B2 | 10/2016 | Wu et al. |
| 9,503,058 | B1 | 11/2016 | Cical et al. |
| 11,043,936 | B1 | 6/2021 | Wu |
| 2002/0180544 | A1 | 12/2002 | Fukayama et al. |
| 2012/0249114 | A1 | 10/2012 | Sako et al. |
| 2012/0249249 | A1 | 10/2012 | Shen |
| 2012/0319793 | A1 | 12/2012 | Iwasa |
| 2013/0176082 | A1 | 7/2013 | Ishikawa |
| 2014/0176250 | A1 | 6/2014 | Thomsen et al. |
| 2014/0218123 | A1 | 8/2014 | Wei et al. |
| 2015/0194929 | A1 | 7/2015 | Tokairin |
| 2019/0386615 | A1 | 12/2019 | Kim et al. |

\* cited by examiner

THERMALLY COMPENSATED CIRCUITS

BACKGROUND

Field

A technology is described related to thermal compensation of circuitry in integrated circuits, including thermal compensation of clock generator circuitry.

Description of Related Art

Integrated circuits can include circuitry with operating characteristics that vary with temperature. For example, clock generators can be designed for target clock periods which set a frequency of the output clock. But actual clock periods may drift from the target as temperature of the circuitry changes. Also, integrated circuits are often specified for use in wide temperature ranges, which can result in significant changes in the operating characteristics of the circuitry across the temperature range.

Thermal compensation technologies have been developed to control the change in operating characteristics of circuitry over wide ranges. These technologies include use of circuit components having so-called complementary-to-absolute-temperature CTAT properties and circuit components having so-called proportional-to absolute-temperature PTAT properties, and combinations of such components, to compensate for thermal drift.

However, scaling of technology to nanometer scale nodes, higher frequencies and lower power supply voltages, presents a need for improved thermal compensation over wide temperature ranges.

SUMMARY

A thermally compensated circuit is described including a first adjustable circuit, like an adjustable current source, to produce a first adjustable signal, such as a reference current. The circuit includes a second adjustable circuit to produce a second adjustable signal, such as a reference voltage. Circuitry responsive to the first and second adjustable signals produces an output signal, such as a clock signal. A tunable circuit in the first adjustable circuit and a tunable first element of the second adjustable circuit set an operating characteristic, such as a clock period, of the output signal to a target level at a first temperature. A tunable second element of the second adjustable circuit sets the operating characteristic of the output signal at the target level at a second temperature.

In examples described herein, tuning of the second tunable element at the second temperature does not substantially change the operating characteristic of the output signal at the first temperature. This can be achieved as described herein by configuring the second adjustable circuit so that voltage across, or current through, the second tunable element can be set to substantially zero at the first temperature by tuning of the first adjustable circuit at the first temperature. As a result, a value such as resistance of the second tunable element does not impact the operating characteristic of the output signal at the first temperature.

In an illustrated circuit, the second adjustable circuit comprises a resistance feedback amplifier. In this circuit, the tunable first element includes a tunable current source setting feedback current of the resistance feedback effectively to zero at the first temperature, and the tunable second element includes a tunable resistor to set a resistance of the resistance feedback to tune the reference voltage to a value at which the operating characteristic of the output signal is set at the target level at the second temperature.

In an illustrated circuit, the first adjustable circuit is a charging circuit of a relaxation oscillator.

An oscillator is described including an adjustable reference current generator to produce an adjustable reference current; a charging circuit to charge a capacitive node as a function of the reference current; a reference voltage circuit to generate a reference voltage at a reference voltage node; and a comparator having inputs operatively coupled to the reference voltage node and to the capacitive node, generating a comparator output. Means for tuning a first element of the reference voltage circuit and the adjustable reference current generator at a first temperature to set a period of the oscillator to a target period are set forth in the description. Also, means for tuning a second element of the reference voltage circuit at a second temperature to set the period of the oscillator to the target period without substantially changing the period at the first temperature are set forth in the description.

A method is described for tuning an oscillator having an adjustable reference current generator to produce an adjustable reference current; a charging circuit to charge a capacitive node as a function of the reference current; a reference voltage circuit to generate a reference voltage at a reference voltage node; and a comparator having inputs operatively coupled to the reference voltage node and to the capacitive node, generating a comparator output. The method comprises tuning a first element of the reference voltage circuit and the adjustable reference current generator at a first temperature to set a period of the oscillator to a target period; and tuning a second element of the reference voltage circuit at a second temperature to set the period of the oscillator to the target period.

Other aspects and advantages of the technology can be seen on review of the drawings, the detailed description and the claims, which follow.

DETAILED DESCRIPTION

A detailed description of embodiments of the present technology is provided with reference to the FIGS. 1-8.

Figure 1:
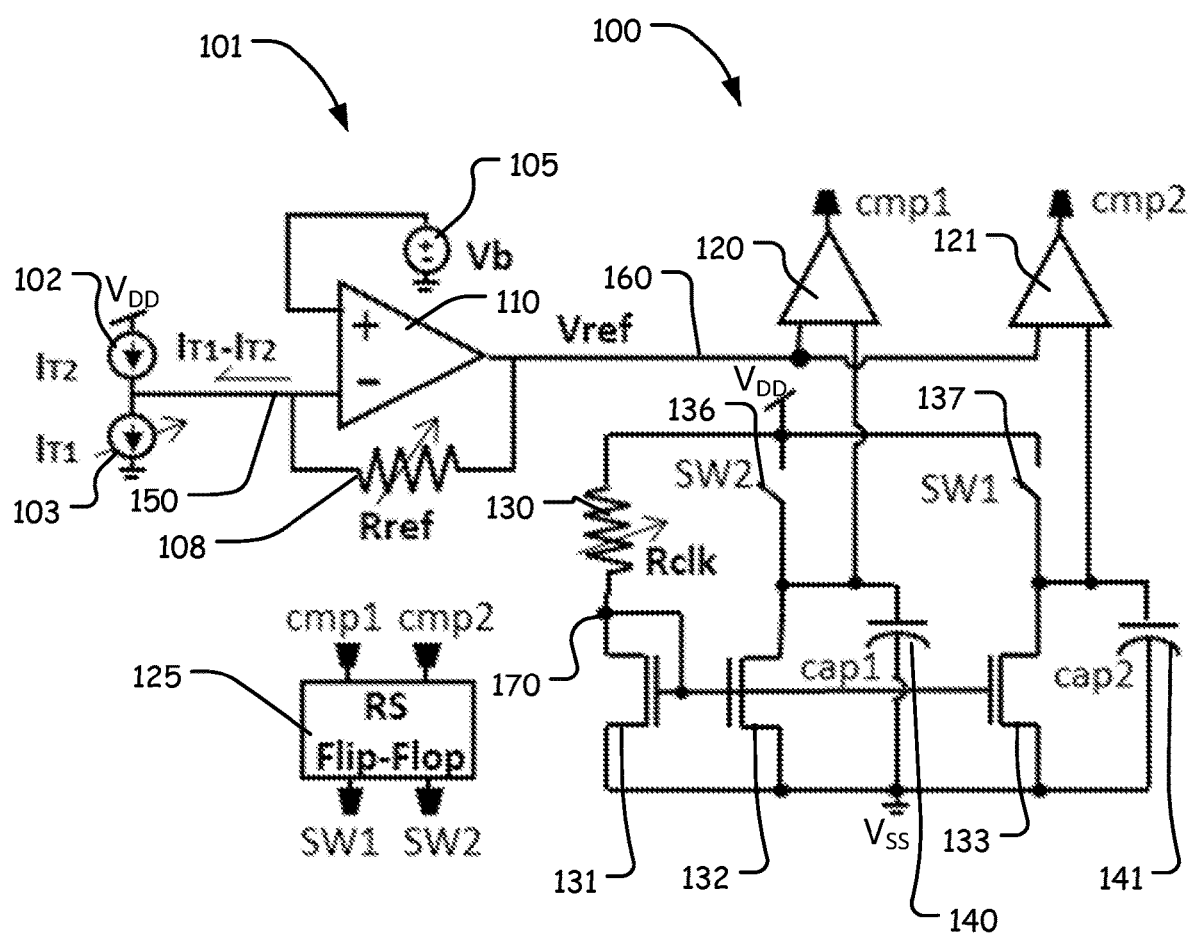
FIG. 1 is a diagram of a clock circuit with improved thermal compensation.

FIG. 1 is a diagram of a clock circuit that includes an oscillator 100 and a reference voltage generator 101. The reference voltage generator 101 includes an operational amplifier 110 having a positive input and a negative input. A tunable current source connected to a node 150 at the negative input includes a current source 102 which generates a current IT2 in a pull-up relationship, or otherwise operably coupled, to node 150 and a current source 103 which generates a current IT1 in a pull-down relationship, or otherwise operably coupled, to node 150. The current sources 102 and 103 can have different thermal coefficients. At least one of the current sources 102, 103 includes a tunable element so that the magnitude of the current IT1−IT2 at the node 150 is tunable. A reference voltage source 105, such as a bandgap reference which is stable over a wide temperature range, is connected to the positive input of the operational amplifier 110. The feedback resistor 108 having a tunable resistance Rref is connected between node 160 at an output of the operational amplifier 110 and node 150 at the negative input of the operational amplifier. The output of the operational amplifier provides the voltage Vref at node 160. The operational amplifier can be a Miller operational amplifier. Other examples of suitable operational amplifiers include a two-stage, cascode op amp, a folded cascade op amp, a telescopic cascode op amp and a triple cascade op amp. Also examples of suitable operational amplifiers can use NMOS or PMOS differential-pair inputs.

The oscillator 100 in this example is a type of relaxation oscillator. The oscillator 100 includes a first comparator 120 having one input connected directly or otherwise operatively coupled to node 160 receiving Vref on the output of the operational amplifier 110, and a second input connected directly or otherwise operatively coupled to a capacitive node at one terminal of the capacitor 140. The oscillator 100 includes a second comparator 121 having one input connected directly or otherwise operatively coupled to node 160 receiving Vref on the output of the operational amplifier 110, and a second input connected directly or otherwise operatively coupled to a capacitive node at one terminal of capacitor 141.

The oscillator includes an adjustable reference current generator to produce an adjustable reference current, which includes resistor 130 having adjustable resistance Rclk in series with transistor 131 between a supply node and a reference ground terminal. The transistor 131 has its gate connected to its drain at node 170, and its source connected to the reference ground terminal. The transistor 131 is connected in a current mirror relationship with transistors 132 and 133 having gates connected to node 170, so that the adjustable resistance Rclk can be used to adjust the current applied to the capacitive nodes on the capacitors 140 and 141. A switch 136 responsive to a control signal SW2 and a switch 137 responsive to a control signal SW1 are connected respectively between the capacitive nodes on capacitors 140 and 141 and the supply node.

The outputs cmp1 and cmp2 of the comparators 120 and 121 are applied as inputs directly or otherwise operatively coupled to a control circuit, including RS flip-flop 125 in this example. The outputs of the control circuit are the control signals SW1 and SW2. The control circuit can be implemented using other types of flip-flop circuits and logic gates.

In operation, capacitor 140 is alternatively charged and discharged in response to the control signal SW2 at a rate determined by the adjustable current set by the resistance Rclk. Likewise, capacitor 141 is alternatively charged and discharged out of phase with the charging and discharging of capacitor 140, in response to the control signal SW1 at a rate determined by the adjustable current set by the resistance Rclk.

The outputs cmp1 and cmp2 of the comparators 120 and 121 flip as the voltages on the capacitors 140 and 141 transition across the reference voltage Vref, causing the control signals SW1 and SW2 to switch. The output of the oscillator can be a square wave having an adjustable period, and can be taken as one or more of the cmp1, cmp2, SW1 and SW2 signals as suits a particular implementation.

The reference voltage generator 101 is not connected to, or is decoupled from, the charging circuit of the oscillator 100. Thus, the voltage at node 160 is isolated from the voltage at node 170, and isolated from the voltages at the capacitors 140 and 141.

As mentioned above, the oscillator 100 in this example is a type of relaxation oscillator. More generally, a relaxation oscillator is an electronic oscillator circuit that produces a repetitive output signal or clock signal, such as a triangle wave or square wave. The circuit includes a feedback loop (including the RS Flip-Flop in the example of FIG. 1) containing a switching device (e.g. SW1, SW2) such as a transistor, comparator, relay, op amp, or a negative resistance device like a tunnel diode, with a charging circuit that repetitively charges a capacitor or inductor through a resistance until it reaches a threshold level, then discharges it again. The period of the oscillator depends on the time constant of the capacitor or inductor circuit, which in the example of FIG. 1 depends on the tunable resistance Rclk. The active device switches the charging circuit abruptly between charging and discharging modes, and thus produces a discontinuously changing repetitive waveform.

The reference voltage generator 101 in this example is a resistor feedback amplifier, including a first tunable element in the current sources 102 and 103, and a second tunable element (resistor 108) in the feedback circuit. The oscillator 100 includes a reference current generator including a third tunable element (resistor 130).

The oscillator is configured so that it can be tuned at a first temperature such as for example 85° C. to set a period of the oscillator output at a target period, such as for example 30 ns. This can be accomplished by tuning of the first adjustable element in the current sources 102 and 103 such that the current $I_{T1}-I_{T2}$ is a zero, and tuning of the resistance Rclk to establish the desired charge and discharge rates of the capacitors 140, 141. With the current IT1−IT2=0, the output Vref of the operational amplifier 110 is equal to Vb, which can be on the order of 0.55 V for example, provided by the reference voltage source 105. Also, there is no current across the resistor 108 at this first temperature. Note that according to Kirchhoff's voltage law (KVL), Vref=Vb+$(I_{T1}-I_{T2})\times$Rref. So when $I_{T1}-I_{T2}$ is zero, Vref=Vb. Vb can be a thermally stable voltage such as may be generated by a bandgap reference voltage generator.

Also, the oscillator is configured so that it can be tuned at a second temperature such as for example 25° C. to set the period of the oscillator output to the target period, by setting the resistance Rref, and therefore the level of Vref on the output of the operational amplifier 110. Thus, the reference voltage generator 101 is calibrated by adjusting a first adjustable element for zero current across resistor 108 at the first temperature, and then calibrated by adjusting a second adjustable element (resistor 108) to set the period of the oscillator at the target period at the second temperature, in the condition that some current flows across the resistor 108. This condition at the second temperature can arise because Vref may vary with temperature because the current IT1−

IT2 has a PTAT property, or alternatively a CTAT property, and the resistance Rclk of resistor 130 can have a PTAT property, or alternatively a CTAT property. As a result of a PTAT property, the period of the oscillator drifts to longer periods for temperatures greater than the first temperature (>85° C.) and to shorter periods for temperatures less than the first temperature (<85° C.). To align the period at the target period (e.g. 30 ns) at the second temperature (25° C.), Vref is modified by adjusting Rref, such as by tuning the length of resistor 108.

This is an example of a circuit in which the first tunable circuit (the current sources 102, 103) includes a first tunable element for calibration at first temperature, and the second tunable circuit (the resistance feedback) includes a second tunable element for calibration at a second temperature.

Means for tuning a first element of the reference voltage circuit and the adjustable reference current generator at a first temperature to set a period of the oscillator to a target period include the current sources 102 and 103, and the current mirror circuit with adjustable resistor 130. Also, means for tuning a second element of the reference voltage circuit at a second temperature to set the period of the oscillator to the target period without substantially changing the period at the first temperature, include the resistor 108 in the resistance feedback amplifier.

In the illustrated embodiment, because there is no current across resistor 108 at the first temperature, the tuning of the resistance Rref across resistor 108 adjusts the period of the oscillator at the second period, but has substantially no impact on the period of the oscillator or on the reference voltage Vref at the first temperature.

Figure 2:
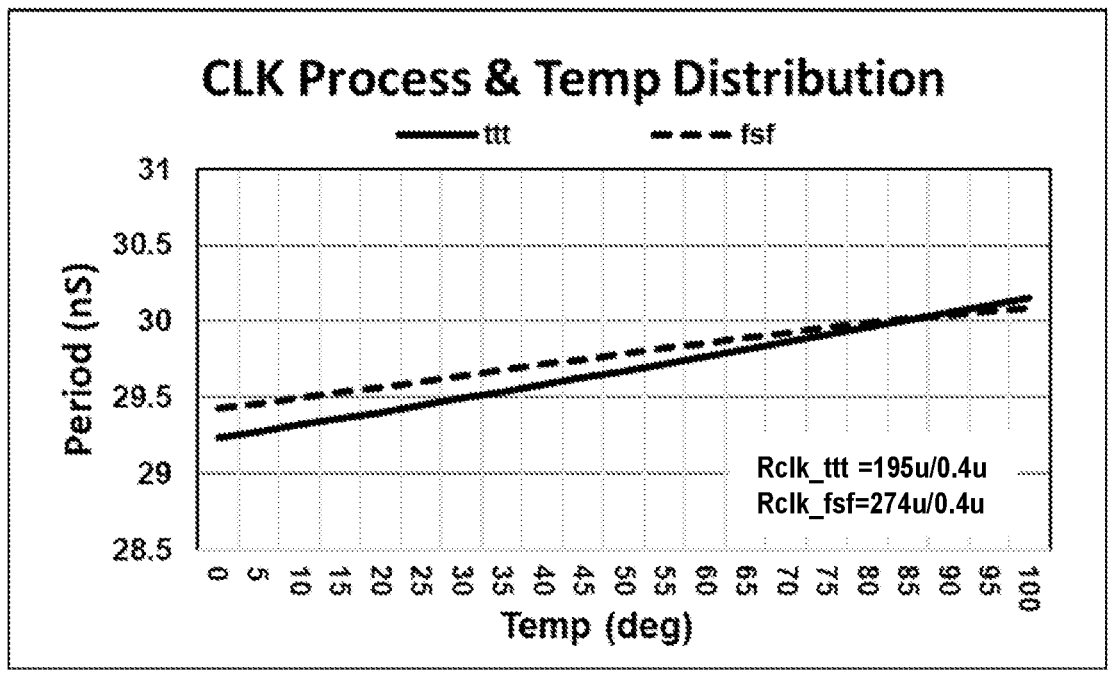
FIG. 2 is a graph of clock period versus temperature of a clock circuit as shown in FIG. 1, tuned at a first temperature over different process corners.
Figure 3:
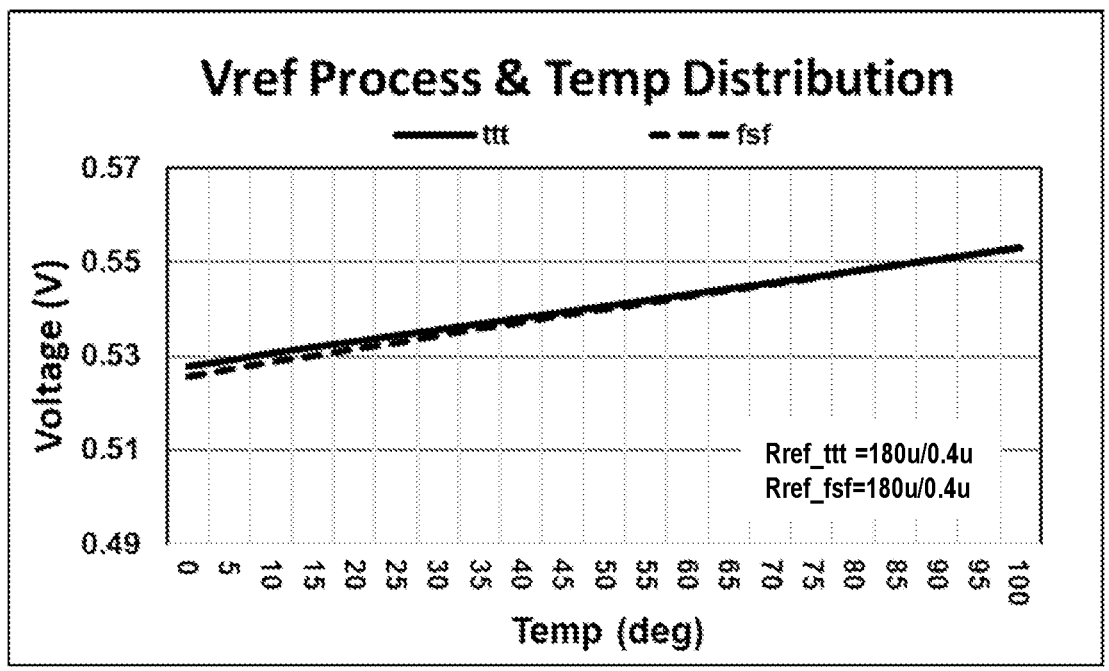
FIG. 3 is a graph of reference voltage Vref versus temperature of the clock circuit as shown in FIG. 1, tuned at the first temperature over different process corners.
Figure 4:
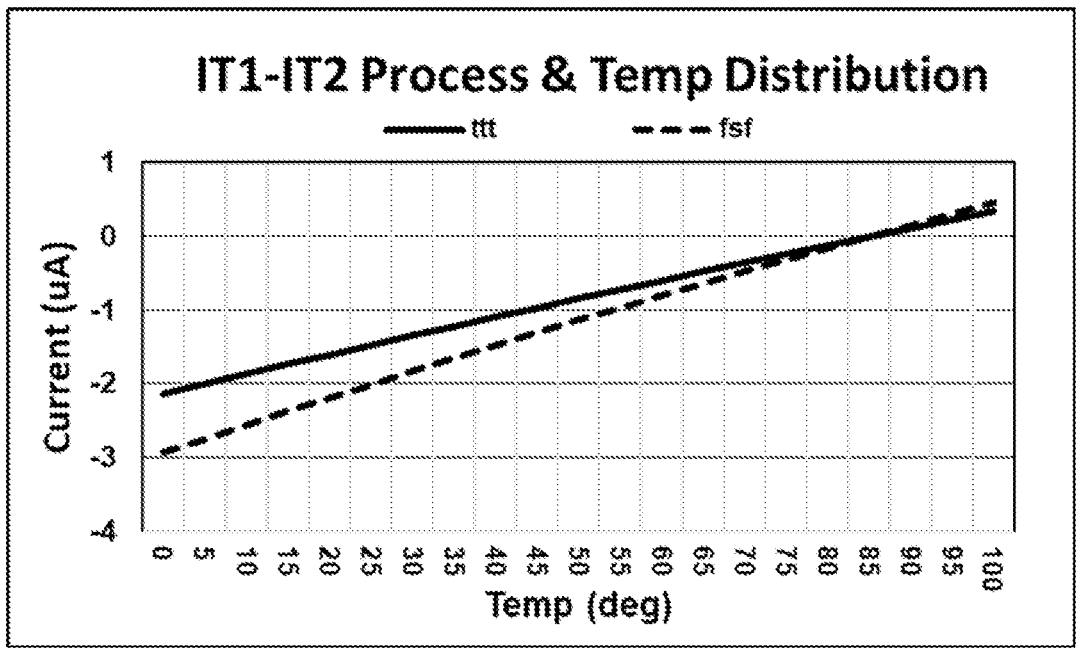
FIG. 4 is a graph of the current difference IT1−IT2 versus temperature of a clock circuit as shown in FIG. 1 over different process corners.

This relationship can be understood with reference to the graphs in FIG. 2 through FIG. 6. FIG. 2 is a graph of clock period versus temperature after calibration at the first temperature equal to 85° C., with IT1–IT2 set to zero, for ttt (typical-typical-typical) and fsf (fast-slow-fast) NMOS, PMOS, resistor process skews. In this example, the period is tuned to 30 ns at 85° C. in a calibration procedure for the devices. As labelled on the graph, the resistance Rclk for the ttt process corner device is tuned by tuning the resistor 130 to a shorter length, and the resistance Rclk is tuned by tuning the resistor 130 to a longer length for the fsf process corner device. FIG. 3 is a graph of Vref voltage versus temperature after calibration at 85° C., for the ttt and fsf process corners. FIG. 4 is a graph of the magnitude of IT1–IT2 current versus temperature, again after calibration to zero, at 85° C.

At a second temperature (25° C. in this example), Vref deviates from Vb because of a PTAT property of IT1–IT2. Also, the resistance Rclk has a PTAT property. As result, the clock period also drifts with temperature. As seen in the graphs of FIGS. 2, 3 and 4, the period, Vref and IT1–IT2 have PTAT properties, and all drift to lower magnitudes as the temperature falls from 85° C., and to higher magnitudes as the temperature rises from 85° C.

Figure 5:
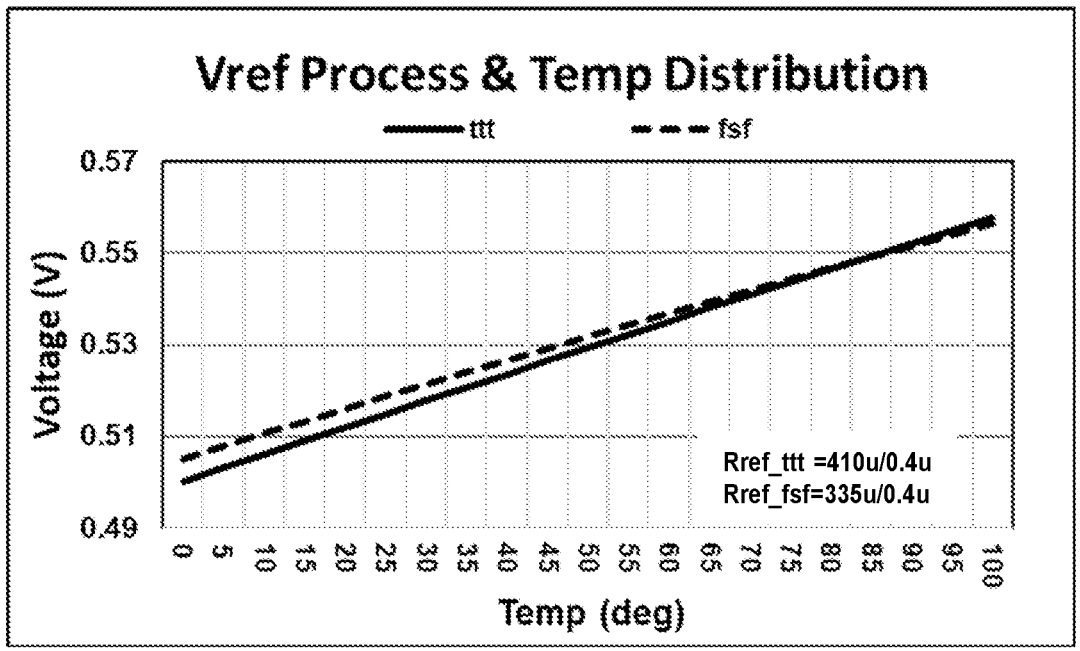
FIG. 5 is a graph of reference voltage Vref versus temperature of the clock circuit as shown in FIG. 1, tuned at the first temperature and at the second temperature over different process corners.

To align the period of the clock to the target period, the Vref is tuned at the second temperature (25° C. in this example) by adjusting the length of the resistor 108, to set the clock period to the target period. As result of the tuning of the Vref, the slope of the magnitude of Vref is changed as illustrated in FIG. 5 (compared to FIG. 3) until the target period is achieved.

Figure 6:
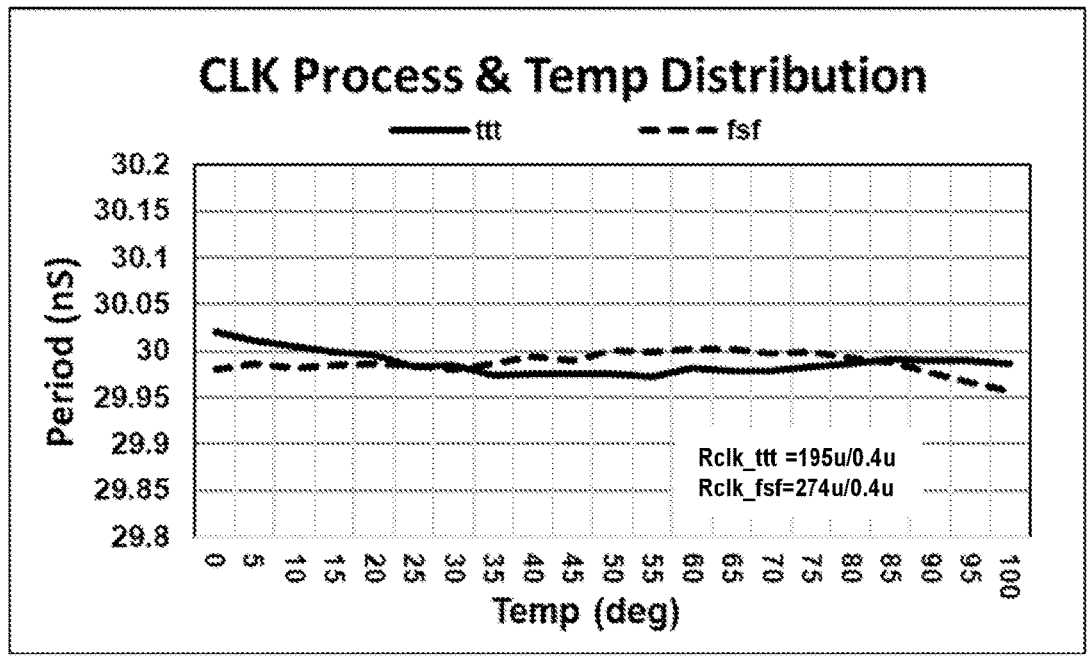
FIG. 6 is a graph of clock period versus temperature of a clock circuit as shown in FIG. 1, tuned at the first temperature and at the second temperature over different process corners.

FIG. 6 is a graph of clock period versus temperature for the ttt and fsf process corners after tuning the length of resistor 108 at 25° C. As seen, the clock period at 25° C. and at 85° C. is set to about 30 ns for both the ttt and fsf process corner devices. The variation across the temperature range from about 0° C. to about 100° C. is less than 0.05 ns (less than 0.02% variation across the temperature range). This can be compared with a graph of FIG. 2 after calibration at 85° C., and without calibration at the second temperature, where the variation across the temperature range varies by as much as 0.8 ns. As illustrated in the graph of FIG. 6, the tuning of the value of Rref at the second temperature (25° C.) to set the period at about 29.98 ns, does not substantially change the period at the first temperature (85° C.) at about 29.99 ns. A substantial change in this context would be greater than 0.02%.

Figure 7:
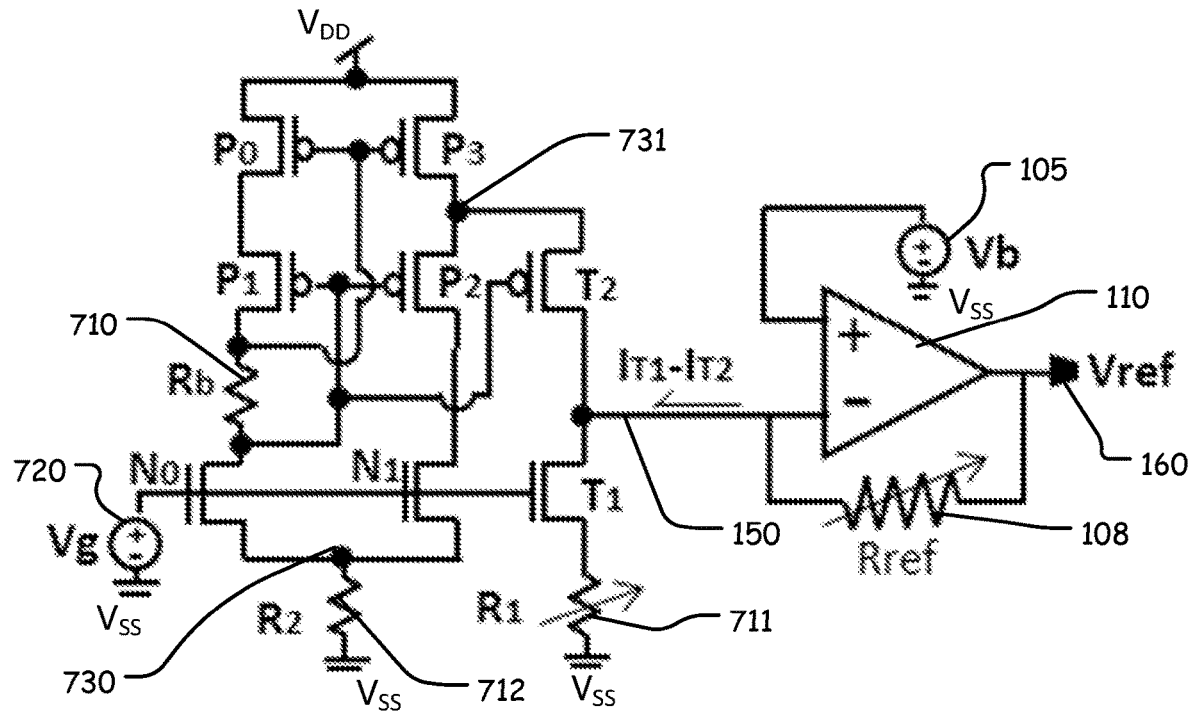
FIG. 7 is a diagram of a reference voltage generator suitable for use in the circuit of FIG. 1.

FIG. 7 is a diagram of a reference voltage generator suitable for use as the reference voltage generator 101 of FIG. 1. The reference voltage generator of FIG. 7 includes a resistance feedback amplifier including components 105, 110 and 108 to produce the voltage reference Vref on node 160, as described with reference to FIG. 1, and such components are not described again. The diagram of FIG. 7 shows an example of a bias circuit for generation of current at node 150. In this example, the bias circuit is a tunable current source circuit for generation of the current $I_{T1}-I_{T2}$ biasing node 150, including a tunable element (resistor 711 in this example).

The tunable current source circuit is connected between a voltage supply node (e.g., $V_{DD}$) and a ground reference node (e.g., $V_{SS}$), and has three current legs. A first current leg includes PMOS transistor $P_0$, PMOS transistor $P_1$, resistor 710 having a resistance Rb, and NMOS transistor $N_0$ connected in series between the voltage supply node and node 730. A second current leg includes PMOS transistor $P_3$, PMOS transistor $P_2$, and NMOS transistor $N_1$ connected in series between the voltage supply node and node 730. A resistor 712 having a resistance $R_2$ is connected between node 730 and the ground reference node. A third current leg includes PMOS transistor $T_2$, NMOS transistor $T_1$ and resistor 711, having a tunable resistance $R_1$, connected in series between node 731 and the ground reference node. Node 731 is connected to the source of transistor $P_2$ and the drain of transistor $P_3$. Node 150 at the negative input of the operational amplifier 110 is connected to the drain of transistor $T_2$ and the drain of transistor $T_1$.

The gates of transistors $P_0$ and $P_3$ are connected together and to the drain of transistor $P_1$. The gates of transistors $P_1$ and $P_2$ are connected together, to the drain of transistor N0 and to the gate of transistor $T_2$. The gates of transistors $N_0$, $N_1$ and $T_1$ are connected together, and to a bias voltage source 720 applying a voltage Vg. Resistor 712 can be a diffusion resistor setting the value of resistance $R_2$. Resistor 711 can be a polysilicon resistor having a tunable size or length, setting the value of the resistance $R_1$. The resistors $R_1$ and $R_2$ can be implemented using other types of resistors, such as metal resistors or active resistors using MOS or BJT transistors operated in the linear range.

A current mirror circuit including PMOS transistors $P_0$-$P_3$ and resistor 710 is formed by this circuit. The aspect ratios of transistors $P_0$, $P_1$ and $P_2$ are equal in this embodiment having a normalized value of "1". The aspect ratio "M" of transistor $P_3$ is larger than that of transistors $P_0$, $P_1$, $P_2$, so that M>1. Also in this example, the aspect ratios of NMOS transistors $N_0$, $N_1$ and $T_1$ are set to be equal so that the transistors have the same threshold voltage Vth.

In this circuit, the currents $I_{P0}$, $I_{P1}$, $I_{N0}$, $I_{N1}$ and $I_{P2}$ in transistors $P_0$, $P_1$, $N_0$, $N_1$ and $P_2$ are equal, and the $I_{T2}$ current in transistor $T_2$ is equal to the difference in currents between transistors $P_3$ and $P_2$ ($I_{P3}-I_{P2}$). Since the current $I_{P3}$ in transistor $P_3$ is M*$I_{P1}$ due to the difference in aspect ratios of transistors $P_3$ and $P_1$, $I_{T2}$ can be characterized as $M*I_{P1}-I_{P2}$, and as $(M-1)*I_{N0}$. As a result, $I_{T2}-I_{T1}$ can be characterized as $(M-1)*I_{N0}-I_{T1}$.

$I_{T1}$ in this circuit is equal to the bias voltage Vg minus the threshold voltage of transistor $T_1$, divided by the resistance $R_1$, or $I_{T1}=(Vg-Vtn)/R_1$. Also, the current $I_{N0}$ in transistor $N_0$ is equal to bias voltage Vg minus the threshold voltage of transistor N0 divided by twice the resistance $R_2$, or $I_{N0}=(Vg-Vth)/2*R_2$. Thus the current $I_{T2}$ in the circuit can be derived as $(Vg-Vth)*(M-1)/2*R_2$.

In the equation set forth of below, equation (1) is a list of the thermal relationships of resistances $R_1$, $R_2$ and Vtn (n-channel Vth) having thermal coefficients $TC_1$, $TC_2$ and $TC_3$ (all greater than zero, respectively, at a reference temperature $t_0$ of 85° C. Note for a PTAT property of the current source for applying a bias current to the node 150, the thermal coefficient $TC_2$ of resistor 711 setting the resistance $R_1$ is set to be greater than the thermal coefficient $TC_1$ of the resistor 712 setting resistance $R_2$. At the temperature 85° C., the circuits are calibrated so that $IT_1-IT_2$ is zero. Therefore, for resistance $R_1$ at this temperature ($R_{10}$) and resistance $R_2$ at this temperature ($R_{20}$), the relation can be derived in equation (2) that $R_{10}(M-1)/2*R_{20}=1$. Equation (3) shows a PTAT property of the difference $IT_1$ minus $IT_2$, based on the MOS threshold voltage and two different types of resistors having different temperature coefficients.

$$R_1 = R_{10}[1 + TC_1(t-t_0)] \quad R_2 = R_{10}[1 + TC_2(t-t_0)] \quad (1)$$

$$V_{tn} = V_{tn0}[1 - TC_3(t-t_0)]$$

$$IT_1 - IT_2 = (V_g - V_{tn})\left[\frac{1}{R_1} - \frac{(M-1)}{2R_2}\right] \quad (2)$$

$$= (V_g - V_{tn})\left[\frac{1 - TC_1(t-t_0)}{R_{10}} - \left(\frac{M-1}{2}\right)\frac{1 - TC_2(t-t_0)}{R_{20}}\right]$$

$$= \frac{(V_g - V_{tn})}{R_{10}}\left\{1 - TC_1(t-t_0) - \frac{R_{10}(M-1)}{2R_{20}}[1 - TC_2(t-t_0)]\right\}$$

$$IT_1 - IT_2 = \frac{(V_g - V_{tn})}{R_{10}}[(TC_2 - TC_1)(t-t_0)] \quad (3)$$

$$= \frac{(V_g - V_{tn}) + V_{tn0}TC_3(t-t_0)}{R_{10}}[(TC_2 - TC_1)(t-t_0)]$$

In alternative implementations, a current source for applying a bias current as shown by equation (3) to the node 150 having a CTAT property can be implemented for example by setting components such that the thermal coefficient $TC_1$ of resistor 711 setting the resistance $R_1$ is greater than the thermal coefficient $TC_2$ of the resistor 712 setting resistance $R_2$.

Figure 8:
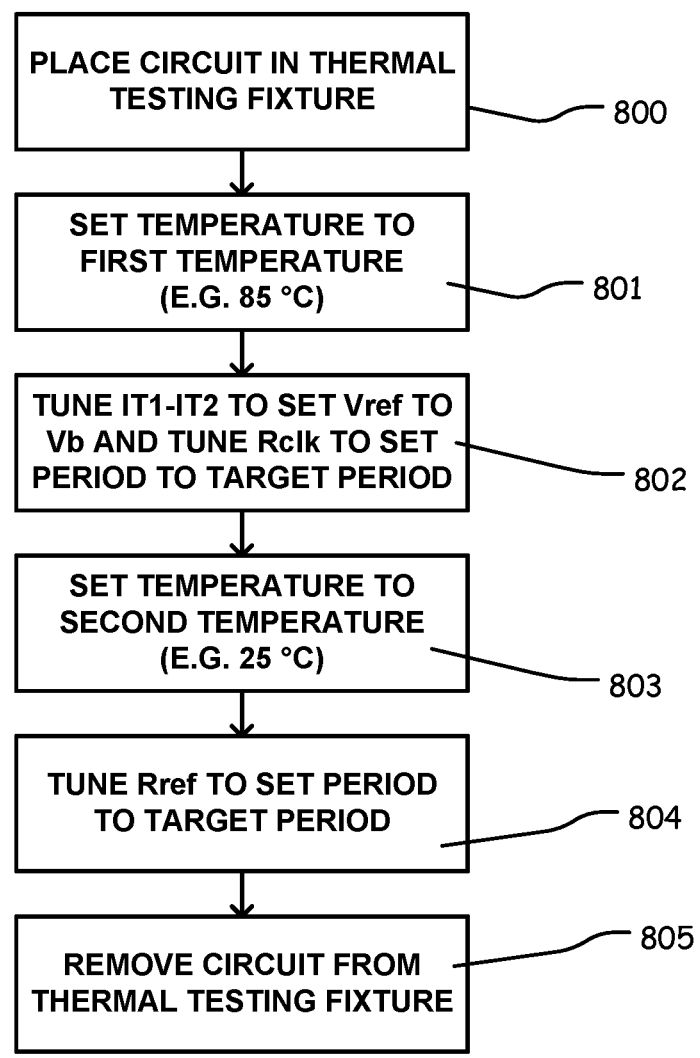
FIG. 8 is a flow chart of a method for tuning a circuit as described herein.

FIG. 8 is a simplified flowchart of a process for calibrating an oscillator like that of FIG. 1 at first and second temperatures. The process includes tuning a first element of the reference voltage circuit and the adjustable reference current generator at a first temperature to set a period of the oscillator to a target period; and tuning a second element of the reference voltage circuit at a second temperature to set the period of the oscillator to the target period.

This process can be executed using packaged or unpackaged integrated circuits including the oscillator. In a first step, the circuit is placed in the thermal testing fixture (800). Then the temperature is set to the first temperature, such as 85° C. (801). While the circuit is at the first temperature, the current $I_{T1}-I_{T2}$ is tuned to 0, such as by adjusting $R_1$ of FIG. 7, setting Vref to Vb and the resistance Rclk is tuned to set the period of the oscillator to the target period (e.g. 30 ns) (802). Next, the temperature of the circuit is set to the second temperature, such as 25° C. (803). Then, while the circuit is at the second temperature, resistance Rref is tuned to set the period of the oscillator to the target period (804). Thereafter, the circuit is removed from the thermal testing fixture (805).

A circuit is described therefore in which the thermal compensation setting at the first temperature (85° C.) can be tuned in a manner that is independent of the thermal compensation setting at the second temperature (25° C.). The examples described herein refer to a first temperature of 85° C. and a second temperature of 25° C. This example is not intended to be limiting. In other examples, the first temperature may be for example 110° C. and the second temperature may be for example −10° C. Thus, the thermally compensated clock periods at the two temperatures are self-consistent, without affecting one another. Circuits as described herein are capable of providing a thermally compensated clock over a wide range, such as from about 25° C. to about 85° C., and from about −10° C. to about 110° C.

A clock circuit is described that is suitable for use in integrated circuits which can demand accurate clock periods over wide temperature ranges, such as memory devices like high density flash memory, high density DRAM memory, high density SRAM memory, microcontrollers, microprocessors, GPUs, mixed-signal devices such as so-called system-on-a-chip SoC devices and so on.

While examples described herein implement a clock circuit or oscillator, other types of circuits requiring thermal compensation can be implemented in this manner. Thus, more generally, the technology described herein includes a first adjustable circuit to produce a first adjustable signal; a second adjustable circuit to produce a second adjustable signal; and a circuit responsive to the first and second adjustable signals to produce an output. In the technology described a tunable circuit in the first adjustable circuit and a tunable first element of the second adjustable circuit are configured to set an operating characteristic of the output signal to a target level at a first temperature. Also, in the technology described, a tunable second element of the second adjustable circuit is configured to set the operating characteristic of the output signal at the target level at a second temperature.

Circuits such as this requiring thermal compensation can take advantage of the characteristics of the resistance feedback amplifier as the second adjustable circuit at the second temperature is biased independently of the first adjustable circuit at the first temperature, and particularly, take advantage of the characteristic of the resistance feedback amplifier in which feedback current can be set to zero at a target first temperature, and the feedback components can be tuned at the target second temperature without impacting the operational characteristic at the first temperature.

A flowchart illustrating a calibration sequence is described herein. It will be appreciated steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow chart herein shows only steps that are pertinent to an understanding of the technology, and it will be understood that numerous additional steps for accomplishing other functions can be performed before, after and between those shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An oscillator, comprising:
an adjustable reference current generator to produce an adjustable reference current;
a reference voltage circuit to generate a reference voltage at a reference voltage node, the reference voltage circuit including first and second tunable circuits, wherein the first tunable circuit includes a first tunable element for calibration at a first temperature, and the second tunable circuit includes a second tunable element for calibration at a second temperature;
a charging circuit to charge a capacitive node as a function of the adjustable reference current;
a comparator having inputs operatively coupled to the reference voltage node and to the capacitive node, generating a comparator output; and
a control circuit operatively coupled to the comparator and the charging circuit, to provide an oscillator output signal.

2. The oscillator of claim 1, wherein the charging circuit includes a discharge current mirror having a gate coupled to the adjustable reference current generator.

3. The oscillator of claim 1, wherein the reference voltage circuit includes a resistor feedback amplifier having an output operatively coupled to the reference voltage node.

4. The oscillator of claim 3, wherein the first tunable circuit includes a bias circuit connected to an input of the resistor feedback amplifier, and the second tunable circuit includes a resistor connected as feedback of the resistor feedback amplifier.

5. The oscillator of claim 1, wherein the reference voltage circuit includes:
an operational amplifier having positive and negative inputs, and having an output operatively coupled to the reference voltage node;
a voltage source connected to the positive input;
the first tunable circuit including a first current source, operatively coupled to the negative input and a second current source operatively coupled to the negative input applying first and second currents at the negative input, and a first tunable element to adjust a difference between the first and second currents at the negative input; and
the second tunable circuit including a second tunable element connected between the output of the operational amplifier and the negative input.

6. The oscillator of claim 5, wherein the first and second current sources have different thermal coefficients.

7. The oscillator of claim 5, wherein the second tunable element is a tunable resistor.

8. The oscillator of claim 5, wherein the first tunable element is a tunable resistor.

9. The oscillator of claim 5, wherein the adjustable reference current generator includes a third tunable element to adjust a magnitude of the adjustable reference current.

10. The oscillator of claim 9, wherein the first tunable element is tuned at the first temperature to set the difference between the first and second currents effectively to zero, the third tunable element is tuned to set a period of the oscillator output signal to a target period at the first temperature, and the second tunable element is tuned to set the period of the oscillator output signal to the target period at the second temperature.

11. The oscillator of claim 9, wherein the first tunable circuit is configured to set a period of the oscillator output signal to a target period at the first temperature, and the second tunable circuit is configured to set the period of the oscillator output signal to the target period at the second temperature, and wherein the second tunable circuit is configured so that voltage across, or current through the second tunable element can be set to substantially zero at the first temperature by tuning of the first tunable circuit at the first temperature.

12. A method for tuning an oscillator having; an adjustable reference current generator to produce an adjustable reference current; a charging circuit to charge a capacitive node as a function of the adjustable reference current; a reference voltage circuit to generate a reference voltage at a reference voltage node; and a comparator having inputs operatively coupled to the reference voltage node and to the capacitive node, generating a comparator output, the method comprising:
tuning a first element of the reference voltage circuit and the adjustable reference current generator at a first temperature to set a period of an oscillator output signal to a target period; and
tuning a second element of the reference voltage circuit at a second temperature to set the period of the oscillator output signal to the target period.

13. The method of claim 12, wherein the reference voltage circuit is a resistance feedback amplifier, and said tuning a first element includes setting feedback current of the resistance feedback amplifier effectively to zero at the first temperature, and said tuning a second element includes setting a resistance of the resistance feedback amplifier at the second temperature to set the period of the oscillator output signal to the target period.

14. The method of claim 12, wherein said tuning of the second element at the second temperature does not substantially change the period of the oscillator output signal at the first temperature.

15. A circuit, comprising:
a circuit responsive to a reference signal to produce an output signal;
an adjustable circuit to produce the reference signal;
a tunable first element of the adjustable circuit to set the reference signal to a first level to adjust an operating characteristic of the output signal to a target level at a first temperature; and
a tunable second element of the adjustable circuit to set the reference signal to a second level to adjust the operating characteristic of the output signal to the target level at a second temperature.

16. The circuit of claim 15, wherein the adjustable circuit is a resistance feedback amplifier, and said tunable first element includes a tunable current source setting feedback current of the resistance feedback amplifier effectively to zero at the first temperature, and said tunable second element includes a tunable resistor to set a resistance of the resistance feedback amplifier to set the operating characteristic of the output signal to the target level at the second temperature.

17. The circuit of claim 15, wherein the circuit responsive to the reference signal is a relaxation oscillator.

18. The circuit of claim 15, wherein the tunable second element of the adjustable circuit is configured so that voltage across, or current through the tunable second element can be set to substantially zero at the first temperature by tuning of the tunable first element of the adjustable circuit at the first temperature.

19. An oscillator, comprising:
- an adjustable reference current generator to produce an adjustable reference current;
- a charging circuit to charge a capacitive node as a function of the adjustable reference current;
- a reference voltage circuit to generate a reference voltage at a reference voltage node; and
- a comparator having inputs operatively coupled to the reference voltage node and to the capacitive node, generating a comparator output;
- means for tuning a first element of the reference voltage circuit and the adjustable reference current generator at a first temperature to set a period of an oscillator output signal to a target period; and
- means for tuning a second element of the reference voltage circuit at a second temperature to set the period of the oscillator output signal to the target period.

* * * * *